US012215022B2

(12) United States Patent
Dagher et al.

(10) Patent No.: US 12,215,022 B2
(45) Date of Patent: Feb. 4, 2025

(54) MICROELECTROMECHANICAL MICROPHONE WITH REDUCED OVERALL SIZE

(71) Applicant: COMMISSARIAT A L'ENERGIE ATOMIQUE ET AUX ENERGIES ALTERNATIVES, Paris (FR)

(72) Inventors: Samer Dagher, Grenoble (FR); Loic Joet, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 817 days.

(21) Appl. No.: 17/206,752

(22) Filed: Mar. 19, 2021

(65) Prior Publication Data

US 2021/0292158 A1   Sep. 23, 2021

(30) Foreign Application Priority Data

Mar. 23, 2020   (FR) ..................... 20 02826

(51) Int. Cl.
 *B81B 7/02*    (2006.01)
 *H04R 19/04*   (2006.01)
 *H04R 19/08*   (2006.01)
(52) U.S. Cl.
 CPC ............... *B81B 7/02* (2013.01); *H04R 19/04* (2013.01); *B81B 2201/0257* (2013.01);
 (Continued)
(58) Field of Classification Search
 CPC . B81B 7/02; B81B 7/0032; B81B 2201/0257; B81B 2201/003; H04R 19/04; H04R 19/005; H04R 19/08
 See application file for complete search history.

(56) References Cited

U.S. PATENT DOCUMENTS 5,659,195 A *   8/1997   Kaiser ................. G01P 15/0802
                                                        257/431
6,521,965 B1 *  2/2003   Lutz ...................... G01L 9/0073
                                                        73/754

(Continued)

FOREIGN PATENT DOCUMENTS

FR        3 059 659 A1    6/2018

OTHER PUBLICATIONS

French Preliminary Search Report issued Nov. 13, 2020 in French Application 20 02826 filed on Mar. 23, 2020 (with English Translation of Categories of Cited Documents), 2 pages.

(Continued)

*Primary Examiner* — Ida M Soward
(74) *Attorney, Agent, or Firm* — Oblon, McClelland, Maier & Neustadt, L.L.P.

(57) ABSTRACT

A microelectromechanical microphone including a microphone unit made from a first substrate, the microphone unit including a movable element capable of being displaced under the effect of a pressure difference and a device for measuring the displacement of the movable element, a cover made from a second substrate, the cover having a first recess, first device for electrically connecting the measurement device to a control unit, the microphone unit and the cover delimiting between them a vacuum space housing the measurement device and a first cavity, from the first recess, partly closed by the movable element, the vacuum space and the first cavity being insulated in a sealed manner from each other, the microphone including a device for mechanically transmitting the displacement of the movable element to the measurement device and a sealed insulation element through which the transmission device passes.

8 Claims, 9 Drawing Sheets

(52) U.S. Cl.
CPC ........ *B81B 2207/093* (2013.01); *H04R 19/08* (2013.01); *H04R 2201/003* (2013.01)

(56) References Cited

U.S. PATENT DOCUMENTS

| | | | | |
|---|---|---|---|---|
| 8,350,346 | B1* | 1/2013 | Huang | B81B 3/0051 257/417 |
| 8,692,340 | B1* | 4/2014 | Ata | B81B 3/001 257/419 |
| 9,714,165 | B1* | 7/2017 | Hrudey | B81C 1/00182 |
| 2010/0005884 | A1* | 1/2010 | Weinberg | G01C 19/5719 73/504.15 |
| 2011/0159627 | A1* | 6/2011 | Mantravadi | G01P 15/123 257/E21.214 |
| 2011/0309458 | A1* | 12/2011 | Gamage | G01L 9/0042 257/419 |
| 2013/0193527 | A1* | 8/2013 | Chu | H01L 21/76898 257/E27.009 |
| 2014/0268344 | A1* | 9/2014 | Arakawa | G02B 26/001 359/580 |
| 2015/0158722 | A1* | 6/2015 | Lim | G01L 23/125 438/51 |
| 2015/0266723 | A1* | 9/2015 | Chan | H04R 1/08 257/416 |
| 2016/0149105 | A1* | 5/2016 | Van Buggenhout | H01L 27/144 257/429 |
| 2016/0244325 | A1* | 8/2016 | Cheng | B81C 1/00293 |
| 2016/0332867 | A1* | 11/2016 | Tseng | B81C 1/00293 |
| 2017/0164107 | A1* | 6/2017 | Murgia | H04R 3/005 |
| 2019/0308873 | A1 | 10/2019 | Joet | |
| 2020/0102212 | A1* | 4/2020 | Hsieh | B81B 7/008 |

OTHER PUBLICATIONS

Tekin, "Review of Packaging of Optoelectronic, Photonic, and MEMS Components", IEEE Journal of Selected Topics in Quantum Electronics, vol. 17, No. 3, May/Jun. 2011, 16 pages.

Lehto et al., "Handbook of Silicon Based MEMS Materials and Technologies: Part V Encapsulation of MEMS Components", Feb. 22, 2010, 118 pages.

U.S. Appl. No. 15/625,314, filed Jun. 16, 2017, 2017/0363424 A1, Maspero, F, et al.

U.S. Appl. No. 16/348,004, filed May 7, 2019, Joet, L, et al.

U.S. Appl. No. 16/590,015, filed Oct. 1, 2019, 2020/0102211 A1, Joet, L, et al.

U.S. Appl. No. 16/716,632, filed Dec. 17, 2019, 2020/0199923 A1, Dagher, S, et al.

U.S. Appl. No. 16/721,578, filed Dec. 19, 2019, 2020/0200976 A1, Dagherj S, et al.

U.S. Appl. No. 16/717,866, filed Dec. 17, 2019, 2020/0203594 A1, Hilt, T, et al.

U.S. Appl. No. 16/761,590, filed May 5, 2020, 2020/0271733 A1, Jourdan, G, et al.

U.S. Appl. No. 16/840,540, filed Apr. 6, 2020, 2020/0318677 A1, Rey, P, et al.

U.S. Appl. No. 16/840,552, filed Apr. 6, 2020, 2020/0317505 A1, Rey, P, et al.

* cited by examiner

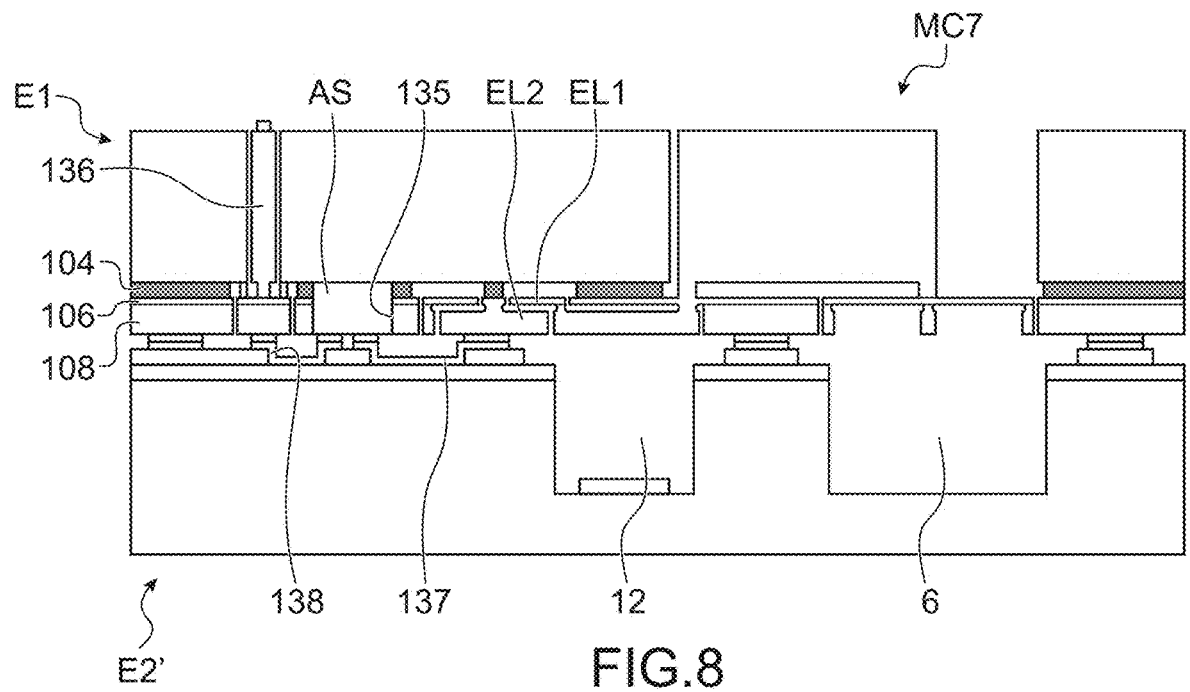
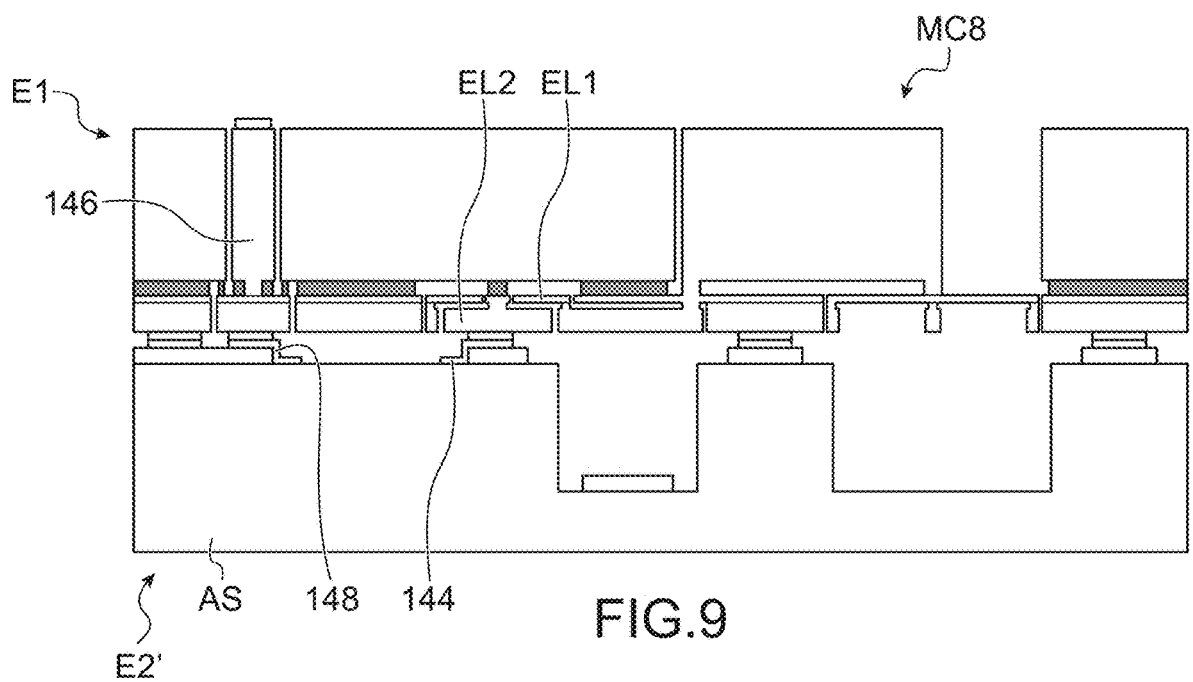

MICROELECTROMECHANICAL MICROPHONE WITH REDUCED OVERALL SIZE

TECHNICAL FIELD AND STATE OF THE ART

The present invention relates to a microelectromechanical microphone and a method for manufacturing a microelectromechanical microphone.

Microelectromechanical or MEMS (Microelectromechanical system) microphones equip many objects, for example mobile phones, personal digital assistants. Their demand is increasing. Furthermore, it is attempted to produce microphones that are both more efficient and of less overall size. But the reduction in the size of the microphones affects their performance.

A MEMS microphone comprises an element sensitive to a pressure difference, one face of which is in contact with the zone in which the sound wave to be picked up is emitted, and one face of which is in contact with a cavity, called the back volume. The back volume is generally connected to the external environment to allow pressure equalisation to atmospheric pressure at low frequency. This cavity generally has a volume of a few mm$^3$ to a few tens of mm$^3$. The larger this volume, the more the acoustic noise associated with this volume decreases. Means measure the displacement of the sensitive element. These measurement means are generally of the capacitive type, the sensitive element forms an electrode and a counter-electrode which is disposed opposite to the sensitive element. The counter-electrode is perforated to allow the sound wave to reach the sensitive element. However, the counter-electrode forms an acoustic resistance, which degrades the detection threshold and also yields damping, which reduces the microphone bandwidth.

Generally, manufacturing a MEMS microphone comprises the step of manufacturing an assembly comprising a sensitive element suspended from a substrate, and means for measuring its displacement relative to the substrate, assembling on one face of the assembly with a support comprising at least one passage in line with the sensitive element to connect the sensitive element to the external environment, and transferring a cover on the support delimiting the back volume with the sensitive element. Such a microphone is of great overall size. It further has the problem of acoustic resistance due to the counter-electrode.

One possibility to solve the problem of resistance of the counter-electrode is to place the capacitive measurement means in a controlled atmosphere. However, it becomes relatively complex to provide a controlled atmosphere space and a back volume while offering a microphone having a reasonable overall size, and the packaging step of which would be relatively simple.

DISCLOSURE OF THE INVENTION

A purpose of the present invention is therefore to offer a high-performance microelectromechanical microphone, transduction means of which are placed in a controlled atmosphere, and the back volume of which is integrated into the MEMS, simplifying its integration and minimising its final size and a method for manufacturing such a microphone.

The purpose set out above is achieved with a microelectromechanical microphone made from two assembled substrates, a first one in which the microphone unit is made and a second substrate forming the cover, also referred to as the packaging. The second substrate includes at least one recess forming with the first substrate a first cavity receiving the sensitive element of the microphone and delimiting the back volume. The first and second substrates also delimit a space, in which there is a controlled atmosphere, advantageously at low pressure, receiving the means for measuring the displacement of the sensitive element, this space being insulated in a seal manner from the first cavity. A transmission means ensures transmission of the displacement of the piston to the controlled atmosphere space, while ensuring insulation of this space and the first cavity.

Thus the back volume and the controlled atmosphere space are directly formed upon assembling both substrates, so it is not required to manufacture it after assembling. The microphone is then directly functional after assembling the microphone unit and the cover.

By virtue of the invention, the microphone has a high level of integration and a reduced overall size.

The above purpose is also achieved with a method for manufacturing microelectromechanical microphones comprising manufacturing a first subassembly comprising at least one sensitive element and measurement means arranged substantially in the same plane and connected by an arm rotatably hinged about an axis contained in the plane, said arm transmitting the displacement of the sensitive element to the measurement means, and manufacturing a second subassembly including at least one first cavity for the sensitive element, and assembling both subassemblies so that the first cavity forms a back volume for the sensitive element and so that they delimit, for the measurement means, a space insulated from the external environment.

The method according to the invention only implements two subassemblies, i.e. it uses two substrates which are structured and then assembled. The manufacturing method is simplified. Further, the measurement means of the microphone are not facing the sensitive element and therefore do not reduce the microphone performance.

In other words, the microphone and the method implement a substrate including the microphone elements and a cover or packaging substrate.

Advantageously, the first subassembly comprises several pairs of sensitive elements/measurement means and the second subassembly at least several first cavities, enabling several microphones to be simultaneously manufactured. The microphones are then singularized, for example by cutting.

One subject-matter of the present application is then a microelectromechanical microphone including:
  a microphone unit made from a first substrate, the microphone unit including a movable element capable of being displaced under the effect of a pressure difference and means for measuring the displacement of the movable element,
  a cover made from a second substrate, said cover having at least one first recess,
  first means for electrically connecting the measurement means to a control unit,
  the microphone unit and the cover being assembled so that they delimit between them a controlled atmosphere space, advantageously a vacuum space, housing the measurement means, and a first cavity from the first recess, the movable element partly closing said first cavity, the controlled atmosphere space and the first cavity being insulated in a sealed manner from each other, said microphone also including means for mechanically transmitting the displacement of the movable element to the measurement means and an sealed insulation element through which the transmission means pass and ensuring sealed passage of the transmission means between the external environment and the measurement chamber while maintaining the sealed insulation.

In one advantageous example, the cover has a second recess which, together with the microphone unit, delimits the vacuum space.

Preferably, the sealed space and the first recess are on a same side of the plane of the sealed insulation element.

In one exemplary embodiment, the connection means are in the cover and are formed by at least one via and/or connection tracks extending in the plane of the cover.

For example, the connection means are in the microphone unit and are formed by at least one via.

The control unit can be an ASIC integrated into the first substrate or into the second substrate.

For example, the measurement means are capacitive and comprise a fixed electrode on the first substrate and an electrode integral with the transmission means.

In another example, the measurement means are measurement means implementing resonating beams.

Another subject-matter of the present application is a method for manufacturing at least one microphone including a movable element configured to displace under the effect of a pressure difference between the external environment and a first cavity, the movable element comprising a face directed to the external environment and a face directed to the first cavity, said first cavity being fluidly connected to the external environment, means for measuring the displacement of the movable element, said measurement means being housed in a measurement chamber insulated inn a sealed manner from the external environment, means for mechanically transmitting the displacement of the movable element to the measurement means connecting the movable element and at least part of the measurement means, an sealed insulation element through which the transmission means pass and ensuring sealed passage of the transmission means between the external environment and the measurement chamber while maintaining the sealed insulation, said method including:
 a) manufacturing a first subassembly including the movable part, part of the mechanical transmission means, the sealed insulation element and at least part of the measurement means,
 (b) manufacturing a second subassembly comprising at least the first cavity,
 (c) manufacturing first electrical connection means for connecting the measurement means to a control unit,
 (d) assembling the first subassembly and the second subassembly so that they delimit a controlled atmosphere space and so that the first cavity faces the second face of the movable element and the first electrical connection means are in electrical contact with the measurement means, and so as to form the measurement chamber insulated in a sealed manner from the external environment,
 (e) structuring the first subassembly to form the other part of the transmission means and releasing the movable element, the mechanical transmission means and the measurement means,
 f) connecting the measurement means to a control unit.

Upon assembling the first subassembly and second subassembly, preferably a controlled atmosphere is created in the measurement chamber.

A getter material can be formed on the second subassembly so that the getter material is in the measurement chamber.

Advantageously, during step b), a second cavity adjacent to the first cavity is formed and delimits, together with the second subassembly, the measurement chamber.

In one exemplary embodiment, manufacturing the first connection means includes making a via through the first subassembly opening into the front face of the first subassembly and connecting directly to the measurement means.

The first connection means can be manufactured on the second subassembly and step f) can include cutting part of the first subassembly to gain access to the first electrical connection means of the second subassembly, and connecting the first electrical connection means to the control unit.

Step f) advantageously includes a step of encapsulating the control unit, the first electrical connection means and part of the first subassembly and the second subassembly.

The control unit may be an ASIC (AS) and the method may include a step of integrating the ASIC into the first or second subassembly. The method may then include manufacturing a housing in the front face of the first or second subassembly and placing the ASIC into said housing.

The method may also include making second means for connecting to the ASIC and making a via in the first or second subassembly so that it connects to the second connection means.

In another exemplary embodiment, the second subassembly is formed from a substrate, said substrate being an ASIC.

Preferably, several microphones are simultaneously manufactured, said first subassemblies being made from the same substrate and said second subassemblies being made from the same second substrate, said method comprising a step of separating the microphones after step e).

BRIEF DESCRIPTION OF THE DRAWINGS

The present invention will be better understood based on the following description and on the appended drawings in which:

FIG. 8 represents a cross-section view of another exemplary embodiment of a microphone obtained by an example of the manufacturing method according to the invention, in which an ASIC is integrated into the front face of the first subassembly, FIG. 9 represents a cross-section view of another exemplary embodiment of a microphone obtained by an example the manufacturing method according to the invention, in which the substrate of the second subassembly is an ASIC.

DETAILED DISCLOSURE OF PARTICULAR EMBODIMENTS

The same references are used to describe elements having substantially the same structure or substantially the same function.

Figure 1:
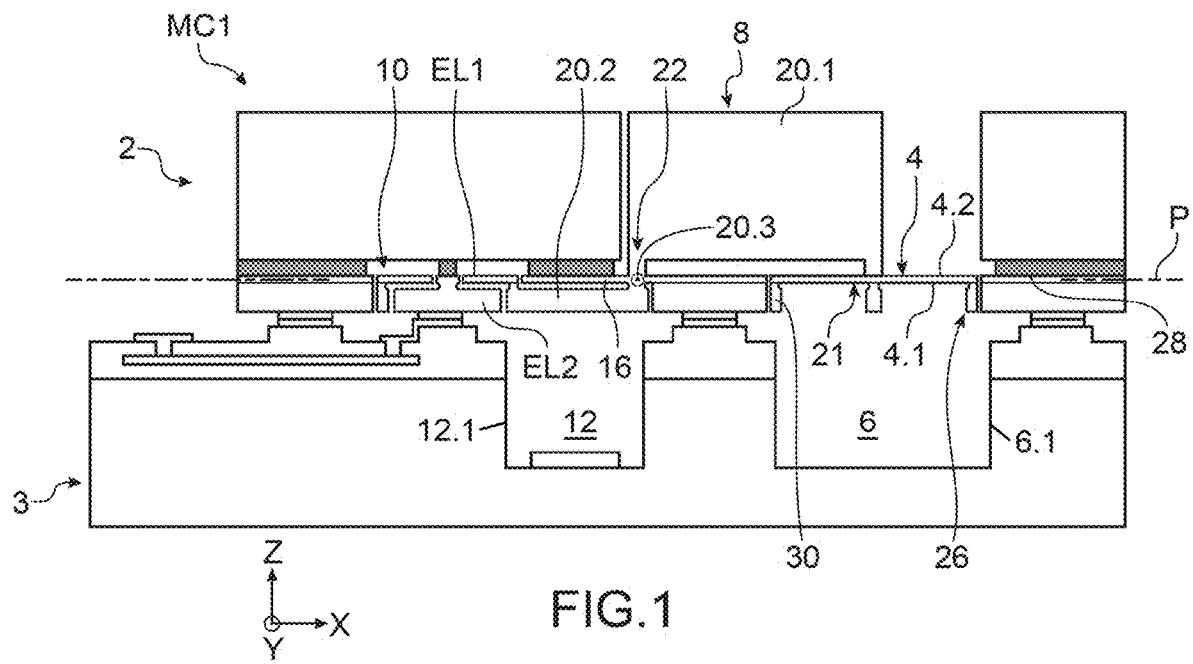
FIG. 1 is a cross-section view of an example of a microphone obtained by the manufacturing method according to the invention.

In FIG. 1 an exemplary embodiment of a microphone MC1 according to the invention can be seen.

The microphone includes a microphone unit 2 and a cover 3.

Microphone unit 2 contains the elements for sensing and measuring the pressure variation. This microphone unit is made from a first substrate, the cover is made from a second substrate and the microphone is obtained directly after assembling the first and second substrates without requiring any additional step.

The microphone unit comprises a piston 4 or element sensitive to pressure variations, means 10 for measuring the displacement of the piston, means 8 for mechanically transmitting the displacement of the piston to the measurement means and an sealed insulation element between the part for sensing the pressure variation and the part for measuring this pressure variation.

In the example represented, the cover includes a first recess which forms the back volume and a second recess which, together with the microphone unit, delimits a controlled atmosphere cavity. In this example the microphone includes, by assembling the microphone unit and the cover, directly two cavities which are insulated in a sealed manner from each other.

Piston 4 is suspended between a chamber 6, called the back volume formed by a first recess 6.1 of the cover, and a zone A, the pressure variations of which caused by sound waves are desired to be measured. The piston has a face 4.1 directed to the back volume and a face 4.2 directed to the zone A. Piston 4 displaces substantially in an out-of-plane Z direction. The plane of the microphone is a plane parallel to the directions in which the largest dimensions of the support and the cover extend.

Measurement means (sensor) 10 are disposed substantially in the plane of the piston and are located in a chamber 12 insulated from zone A and from the back volume, chamber 12 will be called the measurement chamber.

The mechanical transmission means 8 ensure transmission of the displacement of the piston to the measurement chamber 12 while at the same time ensuring insulation of measurement chamber 12 from zone A and from back volume 6.

In the example represented, the measurement means (sensor) 10 are of the capacitive type and detect an air gap variation between a movable electrode EL1 movably integral with the transmission means and a fixed electrode EL2 attached to the support. For example, the movable electrode EL1 is connected to ground and the fixed electrode EL2 is connected to a voltage source, imposing a potential difference between both electrodes.

Measurement chamber 12, formed in part by a second recess 12.1 of the cover, includes a controlled atmosphere, advantageously under vacuum. In the present application, by "controlled atmosphere chamber" it is meant a chamber in which the gas composition and pressure do not vary or vary only slightly over time, several months or even several years, and by "vacuum chamber", it is meant a chamber under a rarefied atmosphere, i.e. at a pressure lower than the pressure of the external environment, preferably much lower than the pressure of the external environment, preferably in the order of 0.1 mbar and 10 mbar. For example, the pressure in measurement chamber 12 is at least lower than 0.1 bar or even lower than 0.01 bar. Reducing the pressure in measurement chamber 12 enables reduction of thermal noise and viscous damping intrinsic to air displacements between the electrodes.

As a variant, the measurement means are made by one or more resonator(s), for example resonating beams, of the guitar string type, advantageously arranged in a low-pressure atmosphere preferably between 0.1 mbar to 10 mbar. Operation in a low-pressure atmosphere enables reduction of friction, which improves the quality factor and transduction gain.

The transmission means include one or more parallel transmission elements extending at rest along an X axis contained in the plane and rotatably hinged by a pivot hinge 22 on support 2. In this example, the transmission element(s) is (are) rigid or slightly deformable. As a variant, when several transmission elements are implemented, they can extend along the X axis, the Y axis or any intermediate angle.

Each transmission element has a first transmission arm 20.1 disposed in the external environment A and a second transmission arm 20.2 disposed in the measurement chamber 12. In this example the two transmission arms 20.1, 20.2 are aligned.

In the example represented, the first transmission arm 20.1 and the second transmission arm 20.2 are rigidly connected by a central portion 20.3, called a transmission shaft.

In the example represented, the first transmission arm 20.1 and the second transmission arm 20.2 are arranged in two distinct planes, the first transmission arm 20.1 being located above a plane P containing the piston and the movable electrode, and the second transmission arm 20.2 being located below the plane P.

The sealed insulation element 16 is located in plane P and ensures sealed insulation between measurement chamber 12 and zone A. The sealed insulation element 16 is adapted to withstand the pressure difference between the external environment and the pressure in measurement chamber 12, especially when the pressure in measurement chamber 12 is reduced as compared to the external environment.

The drive shaft 20.3 passes through the sealed insulation element 16.

In the example represented, the first transmission arm 20.1 connects to a first zone of the side face of the transmission shaft 20.3 and the second transmission arm 20.2 connects to the transmission shaft in a second zone of its side face, opposite to the first zone.

The free end of the first transmission arm 20.1 can be connected to the piston 4 by a hinge transmitting the displacement along the Z direction, while allowing rotation about the Y axis and translation along the X axis. This connection allows rotation of the arm and translation along Z axis of the piston to co-exist. The piston can also be directly connected to the end 20.1. It is then held in rotation by the arm, as represented in FIG. 1.

Likewise, the free end of the transmission arm 20.2 can be connected to the movable electrode by a hinge transmitting the displacement along the Z direction while allowing rotation about the Y axis and translation along the X axis, thus allowing implementing an electrode which is translationally mobile along Z. The movable electrode can also be directly connected to the end of the arm 20.2 and be rotationally displaced, as represented in FIG. 1.

The drive shaft is rotatably hinged about the Y axis in connection with support 2, in the zone that passes through the sealed insulation element. The hinge is made, for example, by means of blades (not visible) which are aligned with the Y axis and able to be torsionally deformed about the Y axis.

Preferably, the blades ensuring rotatable hinge of the transmission arms in connection with the support have a large dimension in the Z direction, thus providing a high degree of rigidity in the out-of-plane Z direction, which advantageously limits the out-of-plane displacement of the transmission element. Thus the pressure difference between the external environment and the measurement chamber does not tend to displace the transmission element and does not influence the measurement.

Preferably, piston 4 is suspended from the support by suspension elements including blades which are deformable in the out-of-plane direction and allowing the piston to displace in the Z direction.

By implementing several transmission arms, forces are recovered at several places on the piston, making it easier to make the piston. Conversely, the device could have several diaphragms connected to a single transmission arm.

Transmission means using a single transmission arm do not depart from the scope of this application.

In the example represented, the piston is trimmed and rigidified by one or more reinforcements. The piston has a rigidifying structure 26 with a thin layer 28 collecting the pressure difference over the entire surface, the thin layer 28 coming from the layer which also forms the sealed insulation element. The layer 28 has a thickness of, for example, a few hundred nanometres to a few micrometres.

The rigidifying structure advantageously includes a rim 30 extending on its external contour so as to lengthen air path between zone A and chamber 6 all around the piston and thus reduce leaks between the outside and the back volume used as a reference.

By virtue of the structure implemented, the pressure is collected over the entire surface and the energy lost in deforming the piston is negligible.

Implementing a thin layer 28 for sealing a rigidifying structure 26 enables a piston with high rigidity to be made, which limits energy losses during deformation, while at the same time advantageously limiting the mass. Indeed, an increase in mass causes a loss of bandwidth.

Further, the piston can take any shape to optimise the size of the microelectromechanical and/or nanoelectromechanical system.

In addition, the sealed insulation element 16 limits displacement in the plane XY.

The sealed insulation element 16 is such that it deforms under the effect of the rotational displacement of the transmission arms, the stiffness of the insulation element is low enough not to provide additional stress, and especially it does not require an increase in the piston surface area.

The sealed insulation element 16 and torsion blades easily deform to allow the transmission arms to rotate about Y and oppose the movements in X, Y and Z directions at this axis of rotation. The amount of energy lost during transmission of the useful movement is limited, so the hinge has a very good mechanical efficiency.

As described for piston 4, the movable electrode can be connected to several transmission elements with different axes of rotation by means of a mechanical connection which allows out-of-plane rotation between the arm and the movable electrode. The movable electrode thus has a translational displacement along the Z axis, provided that the transmission elements all transmit the same displacement.

As a variant, the capacitive measurement means could be surface area varying means using interdigital combs.

Figure 10:
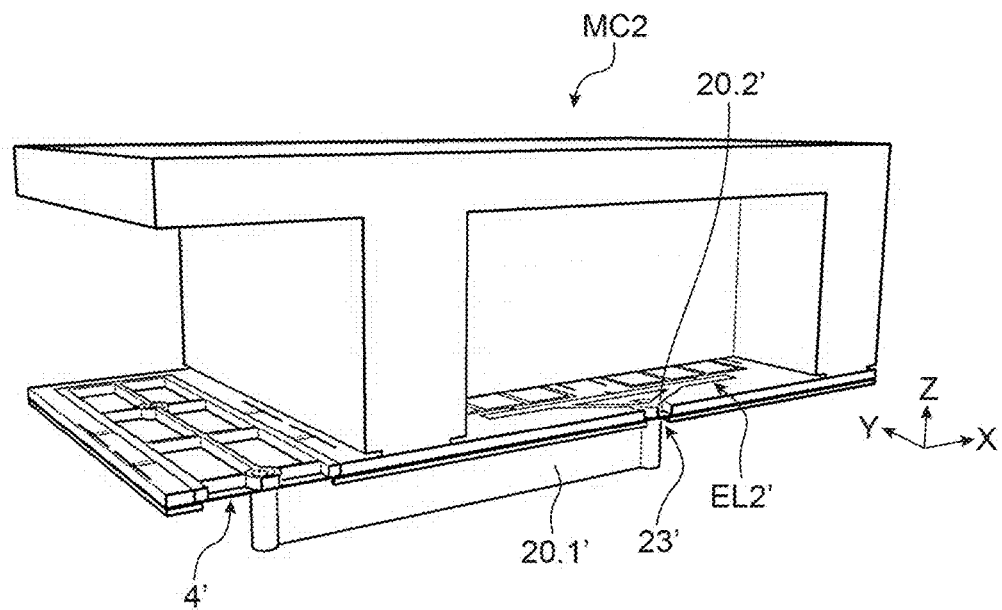
FIG. 10 is a perspective cross-section view of another example of a microphone obtained by an example of the manufacturing method according to the invention, partially represented.

In FIG. 10, another example of a microphone MC2 can be seen. The microphone in FIG. 10 differs from that in FIG. 1 in that the hinge 20.3' of the transmission arms 20.2' is located in the centre of the movable electrode EL2' of the measurement means, as a result the movable electrode EL2' pivots about a Y axis located in the middle thereof. During the displacement of 4' piston, a differential measurement is carried out because there is both an increasing capacitance and a decreasing capacitance. This exemplary embodiment has the advantage of a balanced movable electrode.

An example of a manufacturing method according to the invention of a microphone with improved performance will now be described.

The manufacturing method consists of the following steps of:
  manufacturing a first subassembly, forming the microphone unit, including the piston, the measurement means and at least part of the transmission means, also referred to as the microphone subassembly E1,
  manufacturing a second subassembly E2, forming the cover, for delimiting, together with the microphone subassembly, the back volume of the microphone and the measurement chamber,
  making first electrical connection means,
  assembling the first E1 and second E2 subassemblies,
  structuring the first subassembly through the back face to complete the transmission means,
  connecting the measurement means to a control unit UC.

An exemplary embodiment of the first subassembly E1 will now be described in connection with FIGS. 2A to 2D. This example is not limiting.

For example, a silicon-on-insulator (SOI) substrate 100 is used, comprising a thick silicon layer 102, a SiO2 layer 104 and a single crystal silicon layer 106.

Figure 2A:
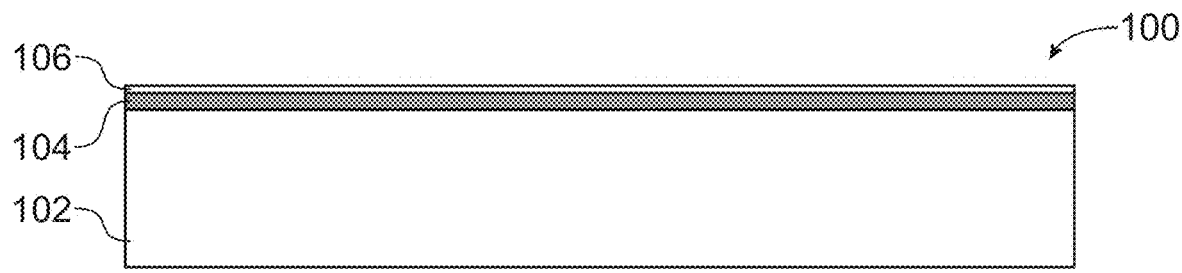
FIG. 2A to FIG. 2M are schematic representations of elements obtained in different steps of an example of a manufacturing method according to the invention.
Figure 2B:
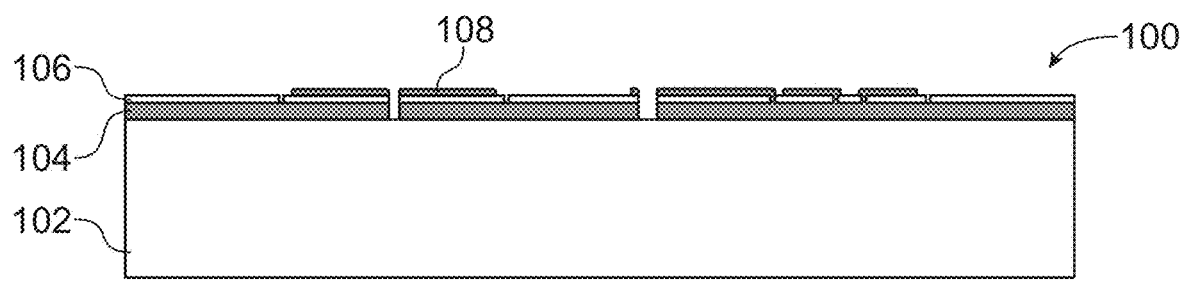

The substrate is represented in FIG. 2A.

The layer 106 is structured, for example, by photolithography and etching. Then a SiO2 layer 108 is formed on the structured layer 106, for example by deposition, for example by chemical vapour deposition or any other suitable type of deposition. The layer 106 forms the thin part of the piston and the sealed insulation element.

Layer 108 is also structured for example by photolithography and etching. The etching of layer 108 can also result in the etching of layer 104 where layer 106 has been previously etched, as is the case in FIG. 2B.

During a next step, a thick silicon layer 110 is formed, for example by epitaxial growth. Then layer 110 is etched, for example by deep reactive ion etching (DRIE).

Figure 2C:
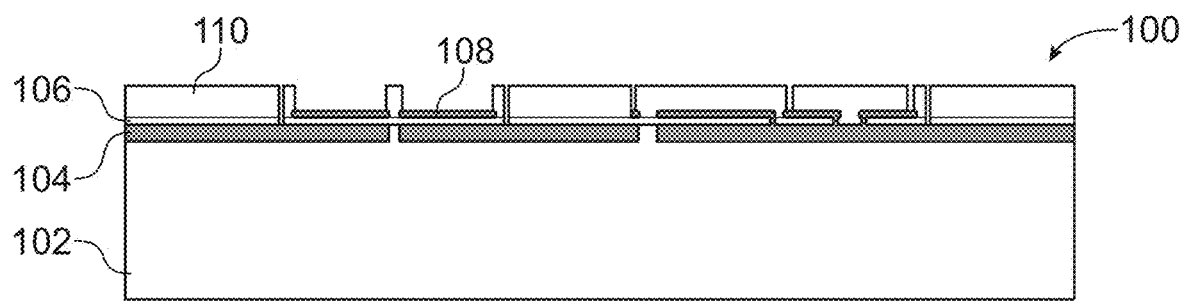

The element obtained is represented in FIG. 2C.

During a next step, the piston, the movable electrode and the second transmission arm 20.2 are released by etching $SiO_2$ from layers 104 and 108, for example by etching with hydrofluoric acid in the vapour phase. This is a time-controlled etching method.

Figure 2D:
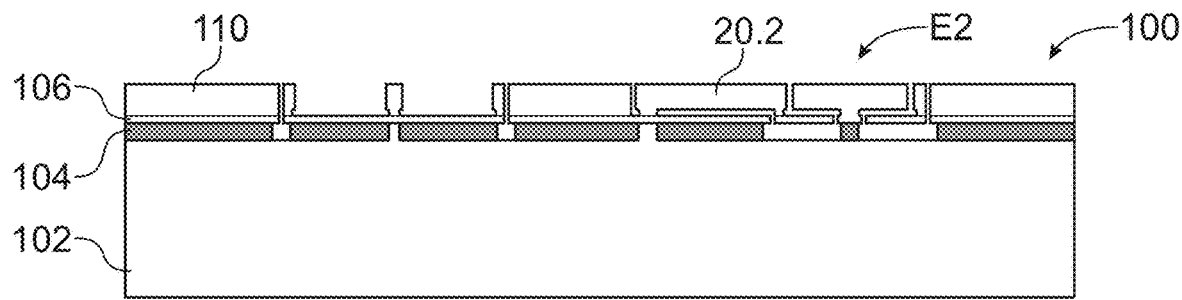

The element thus obtained is represented in FIG. 2D, it is the first subassembly E1.

An example of manufacturing the second subassembly E2 will now be described in connection with FIGS. 2E to 2I. This example is not limiting.

Figure 2E:

A silicon substrate 112 represented in FIG. 2E is for example used.

A full-plate $SiO_2$ layer 114 is formed successively by thermal deposition or oxidation, a metal layer 116, by chemical vapour deposition or any other type of deposition, which is structured, and then a full-plate $SiO_2$ layer 118 is formed.

The metal layer is for forming the first electrical connection means.

Figure 2F:
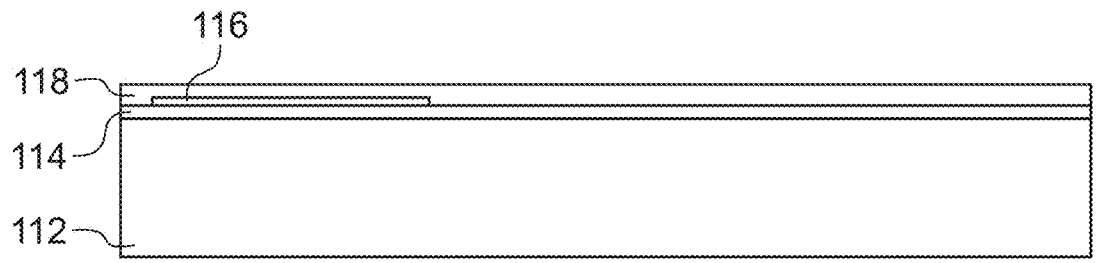

The element obtained is represented in FIG. 2F.

During a next step, a layer 120 is formed on layer 118 and then structured, for example by etching, to form two trenches to gain access to the metal layer 116. It can also be structured in such a way as to create extra thicknesses at some places. For this, a partial time controlled etching or the addition of a stop layer, for example of SiN within layer 120 can be contemplated, to stop etching during etching thereof.

Figure 2G:
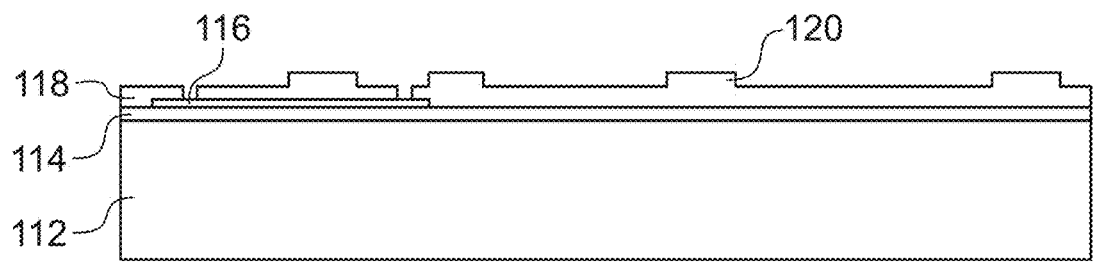

The element obtained is represented in FIG. 2G.

During a next step, a metal layer 122 is formed and structured so as to form contacts in it on the first electrical connection means formed in the metal layer 116 at the trenches. Advantageously, metal layer 122, in addition to making contacts, also ensures mechanical assembling of both subassemblies and ensures sealed insulation of the measurement chamber. For example, layer 122 is structured in order to form sealing beads for providing eutectic sealing.

Figure 2H:
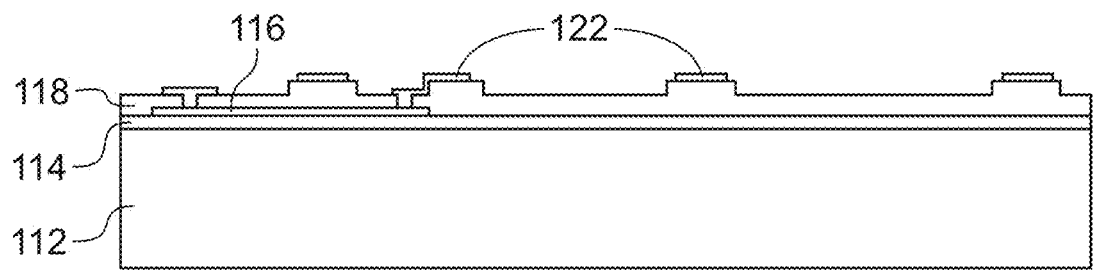

The element obtained is represented in FIG. 2H.

During a next step, the element in FIG. 2H is structured to form cavities 117, 119 to form the back volume and the measurement chamber respectively. For example, the $SiO_2$ layers and substrate 112 are etched by deep reactive ion etching or DRIE.

In the example represented, a getter material 121 is deposited in the bottom of cavity 119 to confirm low pressure in the measurement chamber.

Figure 2I:
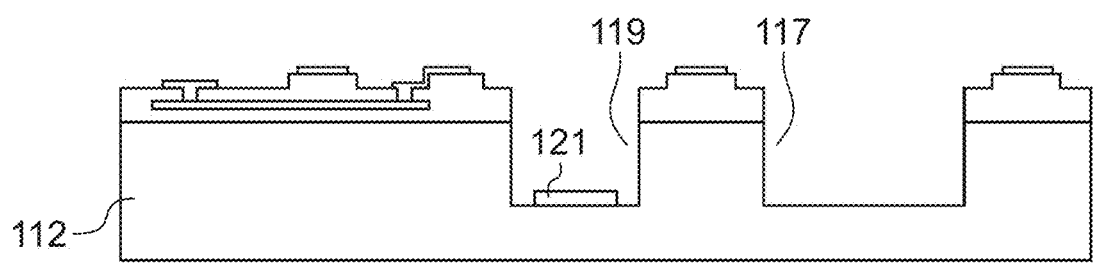

The element obtained is represented in FIG. 2I, this is the second subassembly E2.

Then the subassemblies E1 and E2 are assembled, for example by eutectic sealing, for example aluminium-germanium through their front faces. Sealing is selected, for example, from metal-to-metal sealing, metal eutectic sealing, welding and conductive adhesive sealing.

Figure 2J:
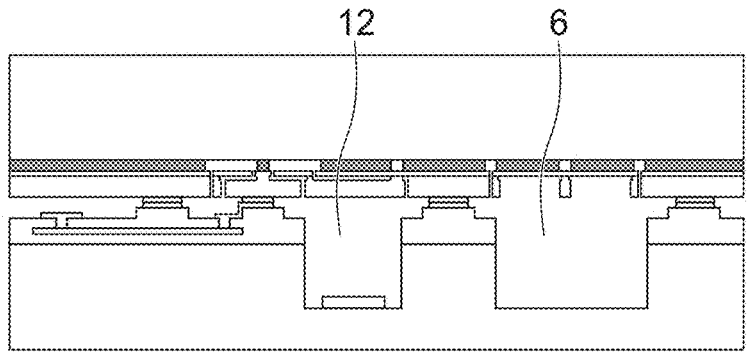

The element obtained is represented in FIG. 2J.

A step of thinning the layer 102 is then performed by grinding to obtain a reduced thickness, typically a thickness of about 100 microns. During one step, the first transmission arm 20.1 is formed by structuring the substrate 102, for example by etching into the back face of the first subassembly.

Figure 2K:
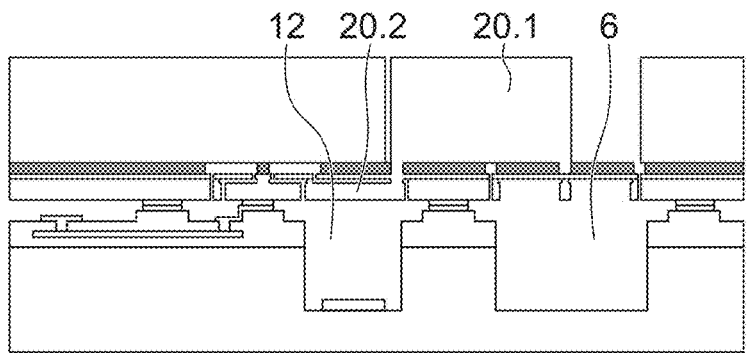

The element obtained is represented in FIG. 2K.

During a next step, the first transmission arm and the face 4.2 of the piston are released, for example by etching with hydrofluoric acid in the vapour phase. This is a time-controlled etching.

Figure 2L:
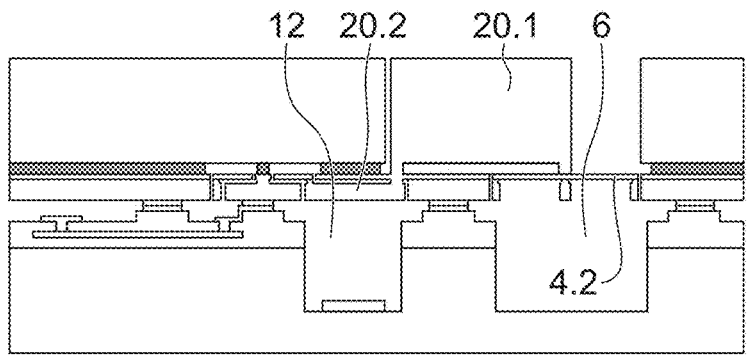

The element obtained is represented in FIG. 2L.

During a next step, the substrate is structured to ensure connection of the measurement means to a control unit UC, for example carried by an ASIC (Application Specific Integrated Circuit).

For example, the first subassembly E1 is cut opposite to the piston so as to disengage a contact carried by the second subassembly and a wire connection is made between the ASIC and the contact.

Figure 2M:
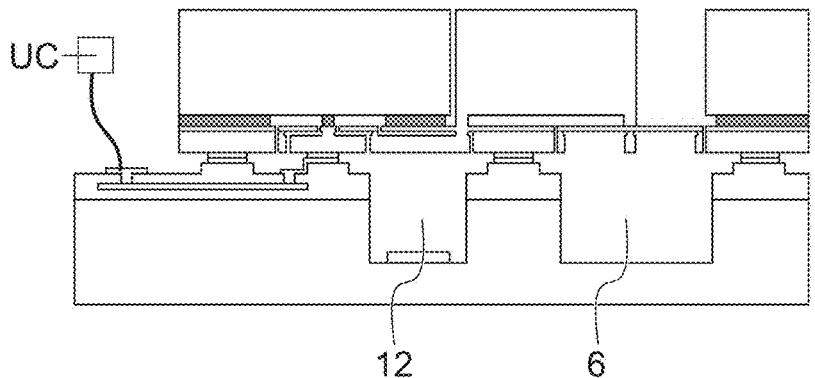

The element obtained is represented in FIG. 2M.

Next, a plastic material is overmoulded onto the ASIC, the wire and the exposed portion of the second subassembly. This overmoulding provides the packaging function and protects the ASIC and the connection.

Figure 3A:
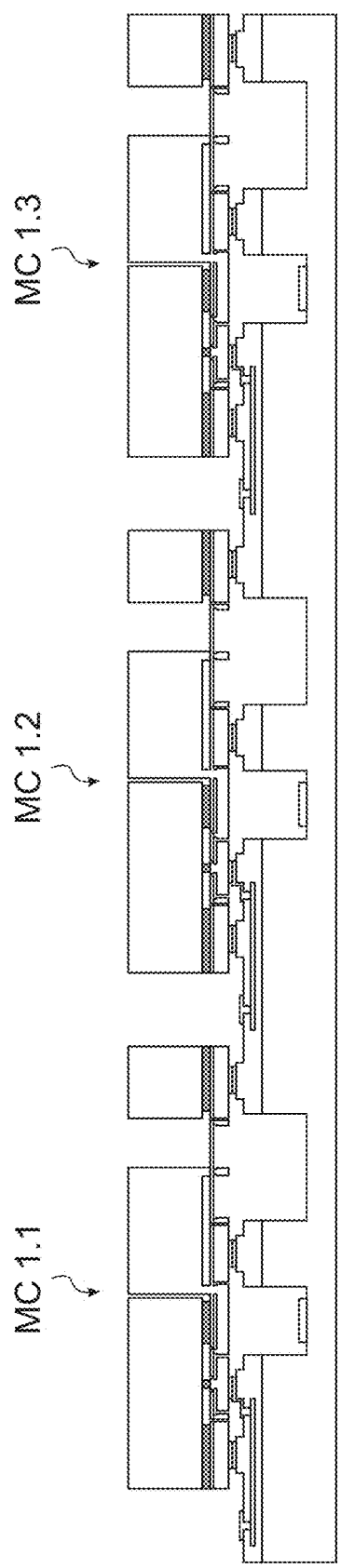
FIGS. 3A and 3B are schematic representations of steps of separating the microphones when several microphones are simultaneously made.

In FIG. 3A, a plurality of microphones MC1.1, MC1.2, MC1.3 simultaneously made can be seen.

Figure 3B:
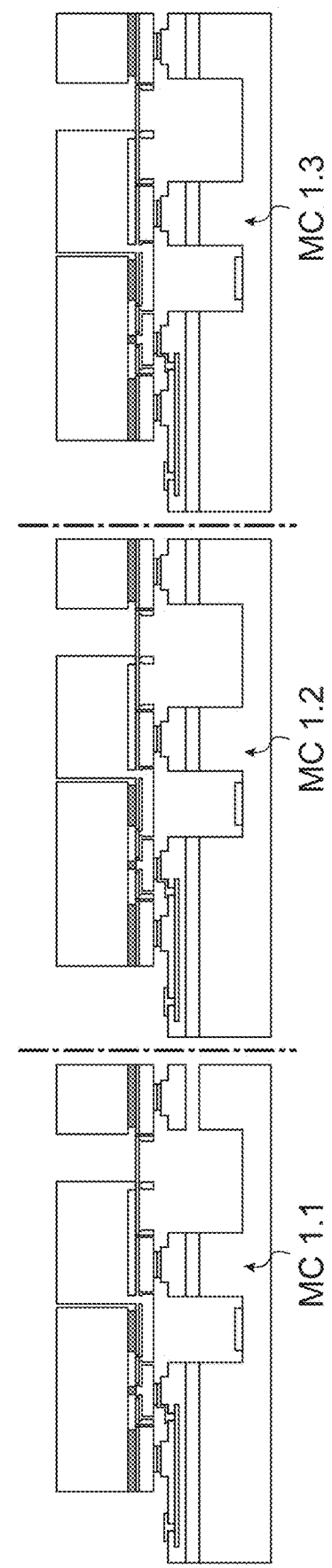

In FIG. 3B, the microphones MC1.1, MC1.2, MC1.3 are separated from each other, for example by cutting symbolized by dashed lines.

In the example represented, the cavities etched in substrate 112 have the same depths, but it can be contemplated that they have different depths. Indeed, it is preferable to have a large back volume, the cavity for partly delimiting this volume is preferably large. As regards the measurement chamber, it is preferable to have a low pressure, which is made easier when the volume is large. As a variant, it can be contemplated not to make a cavity 119 if the front face of the second subassembly is structured in such a way as to allow the displacement of the transmission means.

Figure 4:
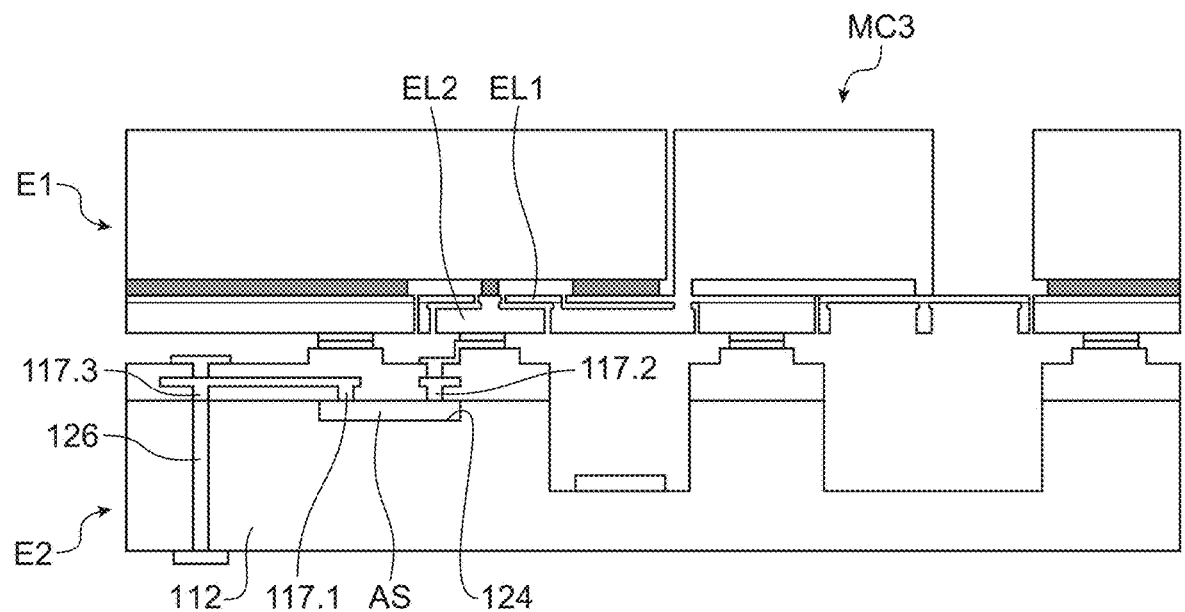
FIG. 4 represents a cross-section view of another exemplary embodiment of a microphone obtained by one example of manufacturing method according to the invention, in which an ASIC is integrated into the front face of the second subassembly.

In FIG. 4, another exemplary embodiment can be seen, of a microphone MC3 formed directly by assembling a microphone unit (subassembly E1) and a cover (E2 subassembly), in which the control unit, for example the ASIC, is integrated into the substrate 112 before the SiO2 layer 114 is formed. For example, the front face of substrate 112 is structured to form a housing 124 to house the ASIC. Then, after the layer 114 is formed on substrate 112, it is structured to provide access to the ASIC and also to a zone of substrate 112. Then, when forming metal layer 116, vias 117.1, 117.2 connected to the ASIC are formed simultaneously and one via 117.3 opening into substrate 112. The ASIC is connected to the connectors formed in the metal layer 116. When forming the contacts from layer 122, the ASIC is connected to the front face of the second subassembly and will be connected to the fixed electrode EL2 upon assembling with the first subassembly.

A TSV (Through Silicon Via) type via 126 is formed through substrate 112 in line with via 117.3 and allows a connector from metal layer 116 to be connected to the back face of the substrate for connection to the outside to recover the signal and supply electric power.

As the ASIC is integrated into the second subassembly, it is no longer necessary to cut the first assembly to gain access to the electrical contact, nor is it necessary to encapsulate the ASIC to protect it. The microphone is self-contained.

Figure 12:
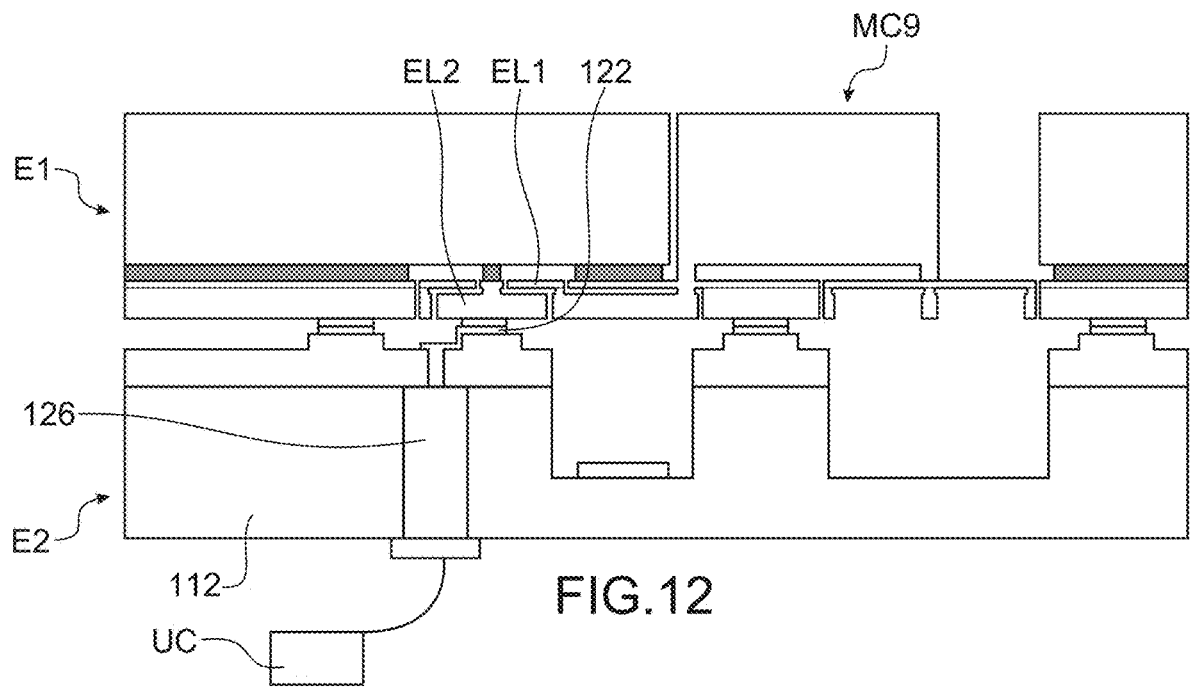
FIG. 12 represents a cross-section view of another microphone in which the control unit is external.

In FIG. 12, a variant of a microphone MC9 can be seen, in which the control unit UC is external to the assemblies E1 and E2, and a via 126 passing through substrate 112 directly above the vacuum cavity is formed. The via 126 connects to the metal layer 122 which is in electrical contact with the fixed electrode EL2. The control unit UC is connected to via 126. The metal layer 122 forms the contact, routing and eutectic sealing at the same time.

Figure 5:
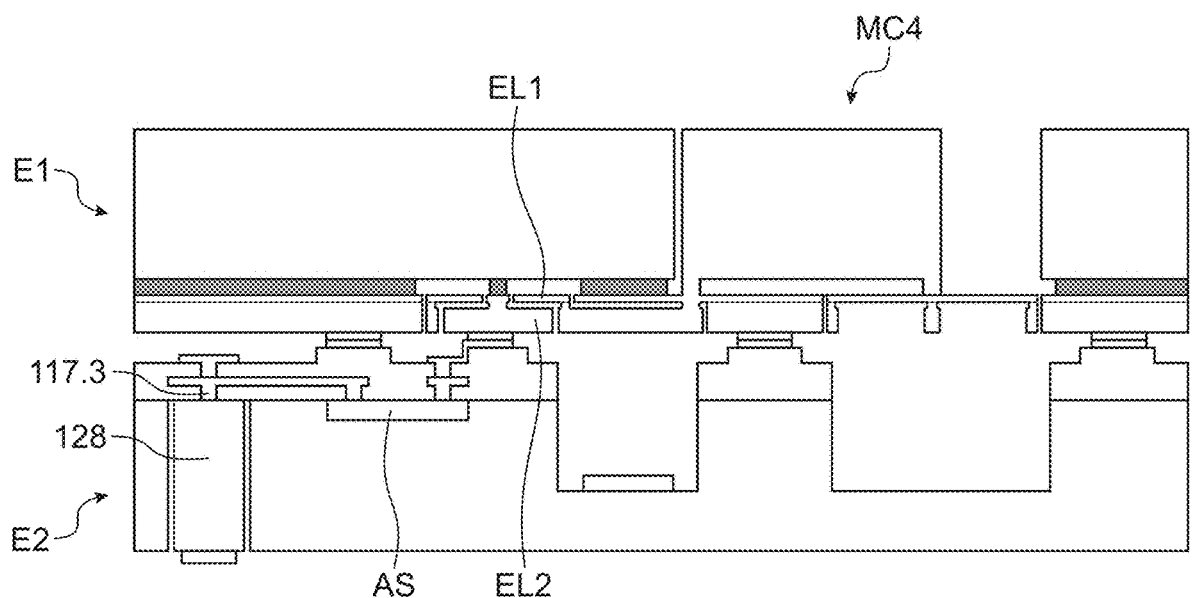
FIG. 5 represents a cross-section view of another variant of the step of electrically connecting the measurement means of the microphone of FIG. 4.

In FIG. 5, a variant of the microphone MC4 in FIG. 4 can be seen, in which the TSV is replaced by a doped silicon via. For this, the substrate is made of doped silicon and a trench is formed so as to delimit a silicon column 128 in line with via 117.3, which will allow the ASIC to be connected to the outside.

Figure 11A:
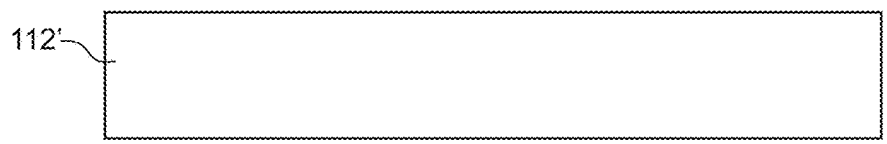
FIG. 11A to FIG. 11D are schematic representations of the steps of a variant for manufacturing the second subassembly.
Figure 11B:
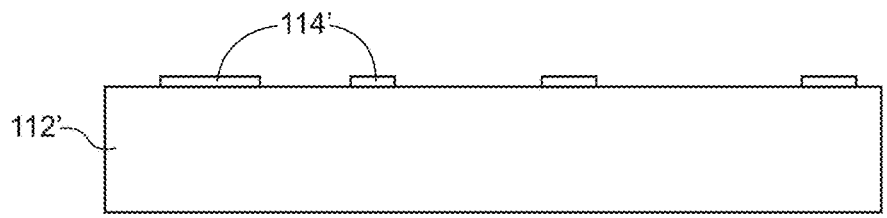

In FIGS. 6 to 9, further examples of microphones also formed directly by assembling a microphone unit (subassembly E1) and a cover (subassembly E2') can be seen. The manufacturing steps for the second subassembly E2' of these examples of microphone differ from those for the second subassembly E2'. In FIGS. 11A to 11D, an example of manufacturing the second subassembly E2' can be seen. From the substrate 112', for example of Si, an oxide layer 114' which is structured is formed. The element obtained is represented in FIG. 11B.

Then a metal layer 122' is formed, which is also structured so as to have only portions on the structured layer 114'. Advantageously, the oxide layer 114' and metal layer 122' are formed and the layers 114' and 122' are simultaneously structured.

Figure 11C:
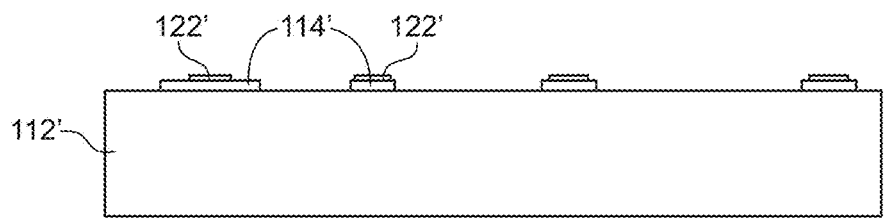

The element obtained is represented in FIG. 11C.

During a next step, the element in FIG. 11C is structured to form cavities 117', 119' for forming the back volume and the measurement chamber respectively. For example, the substrate 112' *is* etched by Deep Reactive Ion Etching (DRIE).

In the example represented, a Getter material 121' *is* deposited in the bottom of the cavity 119' to confirm the low pressure in the measurement chamber.

Figure 11D:
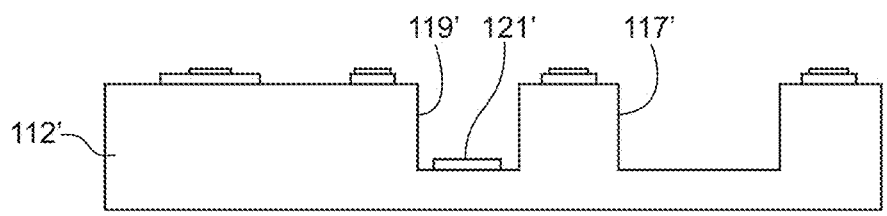

The obtained element is represented in FIG. 11D, this is the second subassembly E2'.

Then the subassemblies E1 and E2' are assembled, for example by eutectic sealing through their front faces.

Figure 6:
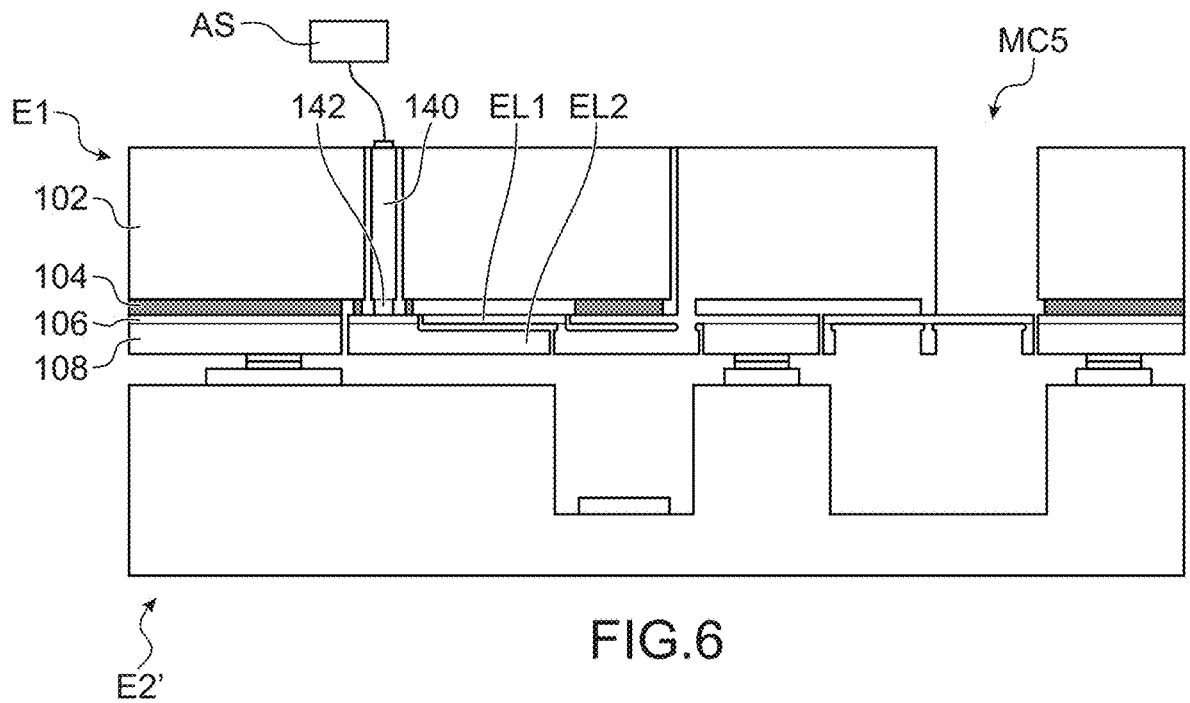
FIG. 6 represents a cross-section view of another variant of the step of electrically connecting the measurement means of the microphone of FIG. 2K.

In FIG. 6, an example of the microphone MC5 made from the subassemblies E1 and E2' can be seen.

The fixed electrode EL2 is connected to the ASIC AS by a via 140 through the $SiO_2$ layers 102. In this example, the shape of the fixed electrode and the shape of the movable electrode are different from those of the electrodes in the previous examples. In this example, the movable electrode does not surround the fixed electrode.

In this example, the first subassembly E1 is made for example of doped silicon and the via 140 is formed by digging a trench so as to delimit a doped silicon column. It is noted that upon manufacturing the first subassembly, especially upon structuring layers 104 and 106, it is provided to open layers 104 and 106 to gain access to substrate 102 in order to make a silicon via 142 through layer 104 upon forming the Si layer 108, and thus ensure Si continuity through the entire thickness of the first subassembly. As a variant a TSV is provided instead of via 140.

Figure 7:
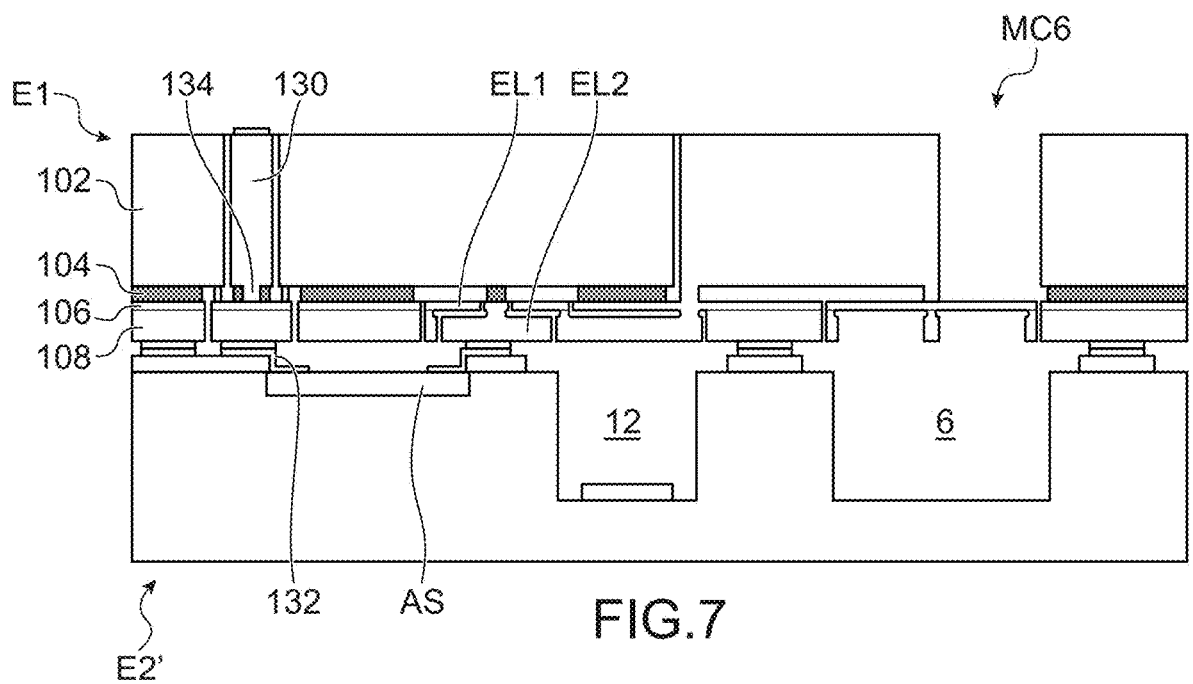
FIG. 7 represents a cross-section view of another variant of the step of electrically connecting the measurement means of the microphone of FIG. 4.

In FIG. 7, an example of the microphone MC6 made from the subassemblies E1 and E2' can be seen. Between the steps in FIGS. 11A and 11B, before forming the oxide layer 114', a housing is formed in the front face of the subassembly E2' to house an ASIC, and during step 11C, the layers 114' and 122' are structured to provide a contact 132 on the ASIC. The connection to the outside is made through the first subassembly. A via 130 is made through the entire thickness of the first subassembly E1 and opens in line with contact 132 connected to the ASIC. In this exemplary embodiment, the first subassembly E1 is made of doped silicon and the via is formed by digging a trench so as to delimit a doped silicon column. It is noted that upon manufacturing the first subassembly, especially upon structuring layers 104 and 106, it is provided to open layers 104 and 106 to gain access to the substrate 102 in order to make a silicon via 134 through layer 104 upon forming the Si layer 108 and thus ensure Si continuity through the entire thickness of the first subassembly. As a variant a TSV is provided instead of via 130.

In FIG. 8, another exemplary embodiment of a microphone MC7 can be seen, into which the ASIC is integrated in the first subassembly.

In this example, housing 135 for the ASIC is formed at the front face of the first subassembly by structuring layers 104, 106 and 108.

The fixed electrode is connected to the ASIC AS by means of a conductive track 137 formed on the front face of the second subassembly E2' and the ASIC is connected to the outside by means of a via 136 formed through the entire thickness of the first subassembly. A conductive track 138 is formed on the front face of the second subassembly E2' and connects the ASIC and the end of via 136 opening into the front face of the first subassembly.

During step 11B, the oxide layer 114' is structured so as not to reveal the front face of the substrate 112' and to allow creation of conductive tracks extending from the front face of second subassembly E2' and which are insulated from substrate 112'.

In FIG. 9, another exemplary embodiment of a microphone MC8 according to the invention can be seen, in which the substrate of the second subassembly is an ASIC AS. The fixed electrode EL2 is connected to the ASIC AS by a contact 144 formed in step 11C, and the ASIC is connected to the outside by a via 146 through the substrate of the first subassembly and a contact 148 formed in step 11C.

It will be understood that any measurement means may be implemented in the sealed chamber such as piezoresistive or piezoelectric means including one or more strain gauges or detection means using resonating beams.

The invention claimed is:

1. A microelectromechanical microphone, comprising:
   a microphone unit made from a first substrate, the microphone unit comprising a movable element capable of being displaced under an effect of a pressure difference, and a sensor configured to measure the displacement of the movable element,
   a cover made from a second substrate, said cover having a first recess, and
   a first electrical connector connecting the sensor to a control circuit, wherein
   the microphone unit and the cover are connected together to define (1) a measurement chamber having a controlled atmosphere at a pressure lower than atmospheric pressure and housing the sensor, and (2) a first cavity formed from the first recess,
   the movable element partly closes said first cavity so that the first cavity is in fluid communication with the external environment,
   the measurement chamber and the first cavity are insulated in a sealed manner from each other,
   said microphone unit further includes at least one transmission member configured to mechanically transmit the displacement of the movable element to the sensor, and a sealed insulation element through which the at least one transmission member passes and ensuring sealed passage of the at least one transmission member between the external environment and the measurement chamber while maintaining the sealed insulation element, and
   the measurement chamber and the first cavity are on a same side of a plane of the sealed insulation element.

2. The microelectromechanical microphone according to claim 1, wherein the cover has a second recess which, together with the microphone unit, defines boundaries of the measurement chamber.

3. The microelectromechanical microphone according to claim 1, wherein the first electrical connector is in the cover and is formed by at least one via and/or conductive tracks extending in a plane of the cover.

4. The microelectromechanical microphone according to claim 1, wherein the first electrical connector is in the microphone unit and is formed by at least one via.

5. The microelectromechanical microphone according to claim 1, wherein the control circuit is an ASIC integrated into the first substrate or into the second substrate.

6. The microelectromechanical microphone according to claim 1, wherein the sensor is a capacitive sensor and comprises a fixed electrode on the first substrate and a movable electrode secured to the at least one transmission member.

7. The microelectromechanical microphone according to claim 1, wherein the measurement chamber space is a vacuum space.

8. The microelectromechanical microphone of claim 1, wherein the movable element has a first face directed to the external environment and a second face directed to the first cavity.

* * * * *